United States Patent [19]
Tsuji

[11] Patent Number: 6,072,300
[45] Date of Patent: Jun. 6, 2000

[54] BATTERY STATE DIAGNOSTIC APPARATUS FOR BATTERY SET AND BATTERY MODULE CHARGER/DISCHARGER

[75] Inventor: Tadashi Tsuji, Kanagawa-ken, Japan

[73] Assignee: Nissan Motor Co., Ltd., Kanagawa-ken, Japan

[21] Appl. No.: 09/190,173

[22] Filed: Nov. 12, 1998

[30] Foreign Application Priority Data

Nov. 14, 1997 [JP] Japan ................................ 9-313628

[51] Int. Cl.[7] ........................................................ H02J 7/00
[52] U.S. Cl. ............................................ 320/116; 324/429
[58] Field of Search .................................. 320/116, 132, 320/DIG. 21; 324/429, 430, 433

[56] References Cited

U.S. PATENT DOCUMENTS

| | | | |
|---|---|---|---|
| 4,876,513 | 10/1989 | Brilmyer et al. | 320/162 |
| 5,111,148 | 5/1992 | Senoo et al. | 324/429 |
| 5,122,751 | 6/1992 | Aita et al. | 324/429 |
| 5,159,272 | 10/1992 | Rao et al. | 320/DIG. 21 |
| 5,206,578 | 4/1993 | Nor | 320/DIG. 21 |
| 5,287,286 | 2/1994 | Ninomiya | 320/DIG. 21 |
| 5,617,324 | 4/1997 | Arai | 320/DIG. 21 |
| 5,789,923 | 10/1995 | Shimoyama et al. | 324/429 |
| 5,923,148 | 2/1996 | Sideris | 324/429 |
| 5,977,750 | 11/1999 | Ng et al. | 320/132 |

*Primary Examiner*—Edward H. Tso
*Assistant Examiner*—Pia Tibbits
*Attorney, Agent, or Firm*—McDermott, Will & Emery

[57] ABSTRACT

A diagnostic apparatus for determining a battery charge status of a battery set, includes a no-load voltage calculating section for detecting no-load voltage VCn of cells; a first judging section for determining whether a battery state of each of the cells C is normal or abnormal based on the cell no-load voltage VCn calculated by the no-load voltage calculating section; and a second judging section for determining that a battery module including the cell determined to be abnormal by the first judging section is an abnormal battery module which is necessary to be exchanged. Further, the battery state diagnostic apparatus may also include a third judging section for determining a battery set is an abnormal battery set which is necessary to be exchanged when the number of battery modules determined to be abnormal is equal to or greater than a predetermined number, and calculating section for calculating the average voltage value of a plurality of battery modules determined to be normal based on the cell no-load voltage VCn.

12 Claims, 12 Drawing Sheets

FIG. 7A
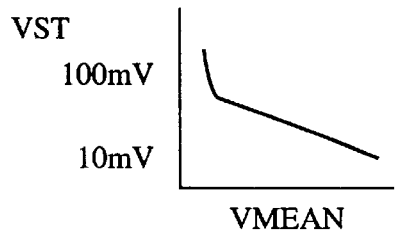
FIG. 7B
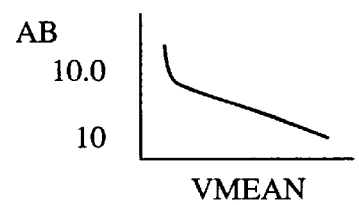
FIG. 7C
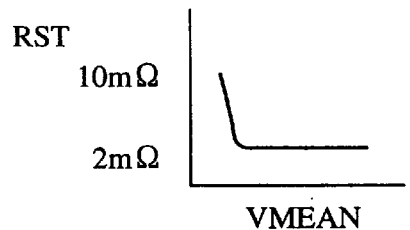
FIG. 8A
| VMEAN | VST | RST |
|---|---|---|
| 2200mV | 100mV | 5mΩ |
| 2500mV | 100mV | 5mΩ |
| 2800mV | 50mV | 2mΩ |
| 3100mV | 50mV | 1mΩ |
| 3400mV | 30mV | 0.5mΩ |
| 3700mV | 30mV | 0.5mΩ |
| 4000mV | 15mV | 0.5mΩ |
| 4300mV | 15mV | 0.5mΩ |
FIG. 8B
| VMEAN | AB |
|---|---|
| 2200mV | 3 |
| 2500mV | 3 |
| 2800mV | 3 |
| 3100mV | 3 |
| 3400mV | 3 |
| 3700mV | 3 |
| 4000mV | 3 |
| 4300mV | 3 |

BATTERY STATE DIAGNOSTIC APPARATUS FOR BATTERY SET AND BATTERY MODULE CHARGER/DISCHARGER

BACKGROUND OF THE INVENTION

1. Field of the Invention

The present invention relates generally to a battery state diagnostic apparatus and more specifically to battery state diagnostic apparatus for a battery set having a plurality of battery modules, and a module charger/discharger.

2. Description of Related Art

In an electric car, it is usual to use battery sets which are each provided With a plurality of battery modules, However, whenever a problem occurs in a battery set, it is necessary to remove the battery set from the car and test each battery module one-by one in order to diagnose the abnormality, deterioration or the like which has occurred. When an abnormal module is found it must be replaced, and if life span of the battery set, the whole battery set must be replaced.

However, since it is necessary to identify the abnormal battery modules by individually testing each of the plurality of batteries constituting the battery set, in the case of a battery set used in an electric car which requires a high voltage source, there is a problem that the number of batteries to be diagnosed is very high, and the diagnosis process is time consuming and troublesome.

Further, SOC (state of charge) of the battery modules constituting the battery set varies with the usage environment, and when the abnormal battery module is replaced the SOC of the new replacement battery module does not always coincide with those of the other modules. If a replaced battery module having a notably different SOC is used with other battery modules, problems such that the replaced battery module may be induced to assume an excessively charged state or an excessively discharged state, tend to occur. This tends to result in the a battery set exhibiting poor performance.

SUMMARY OF THE INVENTION

It is an object of the present invention to provide a battery state diagnostic apparatus (viz., an apparatus which tests the charge state of a battery) which can easily diagnose the state of charge of a battery of a battery set, and to provide a modular charger/discharger (module charger/discharger) which can easily adjust a voltage of a replacement battery module at the time of exchange of the battery module. To achieve the above object, a first aspect of the present invention, is such that there is provided a battery state diagnostic apparatus for a battery set including a plurality of battery modules having a plurality of cells, comprising: a no-load voltage calculating section (or an internal resistance calculating section) for calculating no-load voltage (or internal resistance) of the cell; a first judging section for determining whether a battery state of each of the cells is normal or abnormal based on the no-load voltage (or internal resistance) of the cell calculated by the no-load voltage calculating section (or the internal resistance calculating section); and a second judging section for determining that a battery module including cell determined to be abnormal by the first judging section is an abnormal battery module which requires replacement.

Examples of the no-load voltage calculating section (or an internal resistance calculating section) include cell controller for obtaining a cell voltage (or internal resistance) when there is no load (or load) based on a signal from a voltage sensor provided in a cell and a battery controller for estimating the cell voltage (or internal resistance) when there is no load (or load) based on a discharge characteristic obtained from electric current and voltage during operation/running.

In a preferred embodiment, the battery state diagnostic apparatus further includes a third judging section for determining that, when the number of battery modules determined to be abnormal by the second judging section is equal to or more than the predetermined number, the battery set is abnormal.

With this battery state diagnostic apparatus, since it is automatically determined which battery module of the battery set is abnormal, the exchanging operation of the abnormal battery module is extremely simplified as compared with a conventional exchanging operation in which battery modules are manually checked individually.

In another preferred embodiment, the battery state diagnostic apparatus further includes a calculating section for calculating the average voltage value (or the average internal resistance) of the battery modules determined to: be normal by the second judging section, based on the no-load voltage (or internal resistance) of the cell calculated by the no-load voltage calculating section (or the internal resistance calculating section).

With this battery state diagnostic apparatus, since the average voltage value of normal battery modules used for a target voltage for adjusting a replacement battery module which to replace the abnormal battery module, is automatically calculated by the calculating section, the adjusting operation of the battery at the time of exchange of the battery module is facilitated.

A second aspect of the present invention, features the arrangement wherein an electric car which has a battery set including a plurality of battery modules having a plurality of cells, is equipped with a battery state diagnostic apparatus of the type described above.

With this electric car, since the battery state diagnostic apparatus is mounted on the vehicle, the battery state is automatically diagnosed while the battery set remains mounted in the electric car.

A third aspect of the present invention features the provision of a module charger/discharger for adjusting a voltage of a replacement battery module which is used to replaced an abnormal battery module of a battery set. The module charger/discharger comprises an average voltage calculating section for calculating the average voltage value of a plurality of battery modules determined to be normal by the judging section of the battery state diagnostic apparatus described above, wherein the replacement battery module is charged or discharged such that the voltage of the replacement battery module assumes the average voltage value calculated by the average voltage calculating section.

A fourth aspect features a module charger/discharger for adjusting a voltage of a replacement battery module which is to replace an abnormal battery module of a battery set including a plurality of battery modules having a plurality of cells, wherein the replacement battery module is charged or discharged such that the voltage of the replacement battery module assumes the average voltage value calculated by the calculating section of the battery state diagnostic apparatus described above.

With these module charger/dischargers, the replacement battery module is automatically charged or discharged such that a voltage of the replacement battery module assumes the average voltage value calculated by the average voltage calculating section or the calculating section of the battery state diagnostic apparatus. Therefore, the voltage of the replacement battery module is automatically adjusted when the battery module is exchanged and thus the amount of time required to exchange the battery modules is shortened.

BRIEF DESCRIPTION OF THE DRAWINGS

The various features and advantages of the invention will become more clearly appreciated as a description of the preferred embodiments of the invention is given with reference to the appended drawings wherein:

FIGS. 7A and 7B are graphs showing one example of the average voltage VMEAN dependency of prescribed voltage VST, variable AB, and prescribed internal resistance RST, wherein FIG. 7A shows the prescribed voltage VST, FIG. 7B shows the variable AB, and FIG. 7C shows the prescribed internal resistance RST;

FIGS. 8A and 8B are conversion tables of eight lattices showing the prescribed voltage VST and the prescribed internal resistance RST, and the variable AB, wherein FIG. 8A shows the prescribed voltage VST and the prescribed internal resistance RST, and FIG. 8B shows the variable AB;

FIGS. 13A and 13B are diagrams conceptionally showing variations in current 1 and voltage V at the time of charging and discharging, wherein FIG. 13A shows a variation in current l, and FIG. 13B shows a variation in voltage V.

DETAILED DESCRIPTION OF THE PREFERRED EMBODIMENT

An embodiment of the present invention will now be described with reference to FIGS. 1 to 13.

Figure 2:
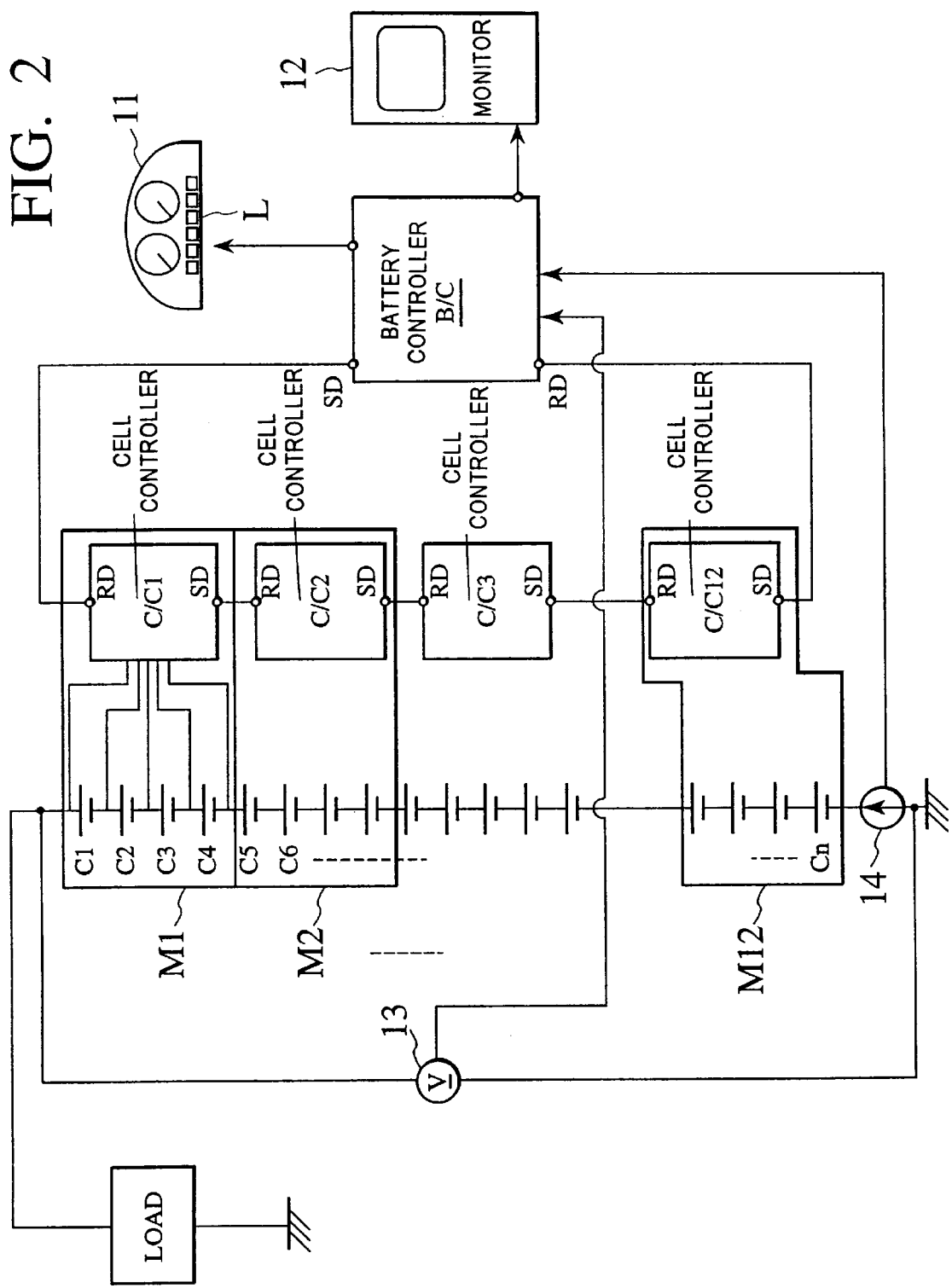
FIG. 2 is another block diagram showing the embodiment of a battery state diagnostic apparatus according to the present invention.

Referring to FIG. 2, a battery set includes n-number of cells C1 to Cn which are connected to one another in series. The cells C1 to Cn are grouped, of the predetermined number, into modules batteries M1, . . . , M12. Although the battery module M1 illustrated in FIG. 2 comprises four cells C1. C2, C3 and C4, in the actual case, eight cells constitute one battery module, and twelve battery modules M1 to M12, i.e., ninety six cells (8×12=96) constitute one battery set. The number of cells constituting the battery set and each of the battery modules is, of course, not limited to the above number.

C/C1, C/C2, . . . , C/C12 represent cell controllers for managing the cells in module units, while the cell controller C/C1 controls the charging and discharging of the cells included in the battery module M1. B/C represents a battery controller mounted in a vehicle which controls each of the cell controllers C/C1, C/C2, . . . , C/C12. and manages the battery set. The battery controller B/C supplies electric power to each of the cell controllers C/C1, C/C2, . . . , C/C12, and receives cell information from the controllers C/C1, C/C2, . . . , C/C12 through a serial communication by a sending terminal SD and a receiving terminal RD.

Cell voltage of each of cells C1 to Cn detected by each of the cell controllers C/C1. C/C2, . . . , C/C12 are sent to the battery controller B/C through the serial communication. The battery controller B/C diagnoses battery state of the battery modules M1 to M12 based on the cell voltage, and if there is abnormality, the battery controller B/C sends a signal to a warning device 11 provided in the vehicle to issue a warning of battery abnormality. For example, a warning lamp L of a meter is illuminated.

The reference number 12 represents a monitor device for displaying the number of abnormal battery modules or an adjusting target voltage of a replacement battery module which will be described later. In general, the monitor device 12 is a trouble diagnostic tool which displays not only the battery abnormality but also any malfunction which has occurred in the vehicle system. A voltage sensor 13 detects a voltage of the battery set and sends a detected voltage signal to the battery controller B/C. A current sensor 14 detects a current of the battery set and sends a detected current signal to the battery controller B/C.

Figure 1:
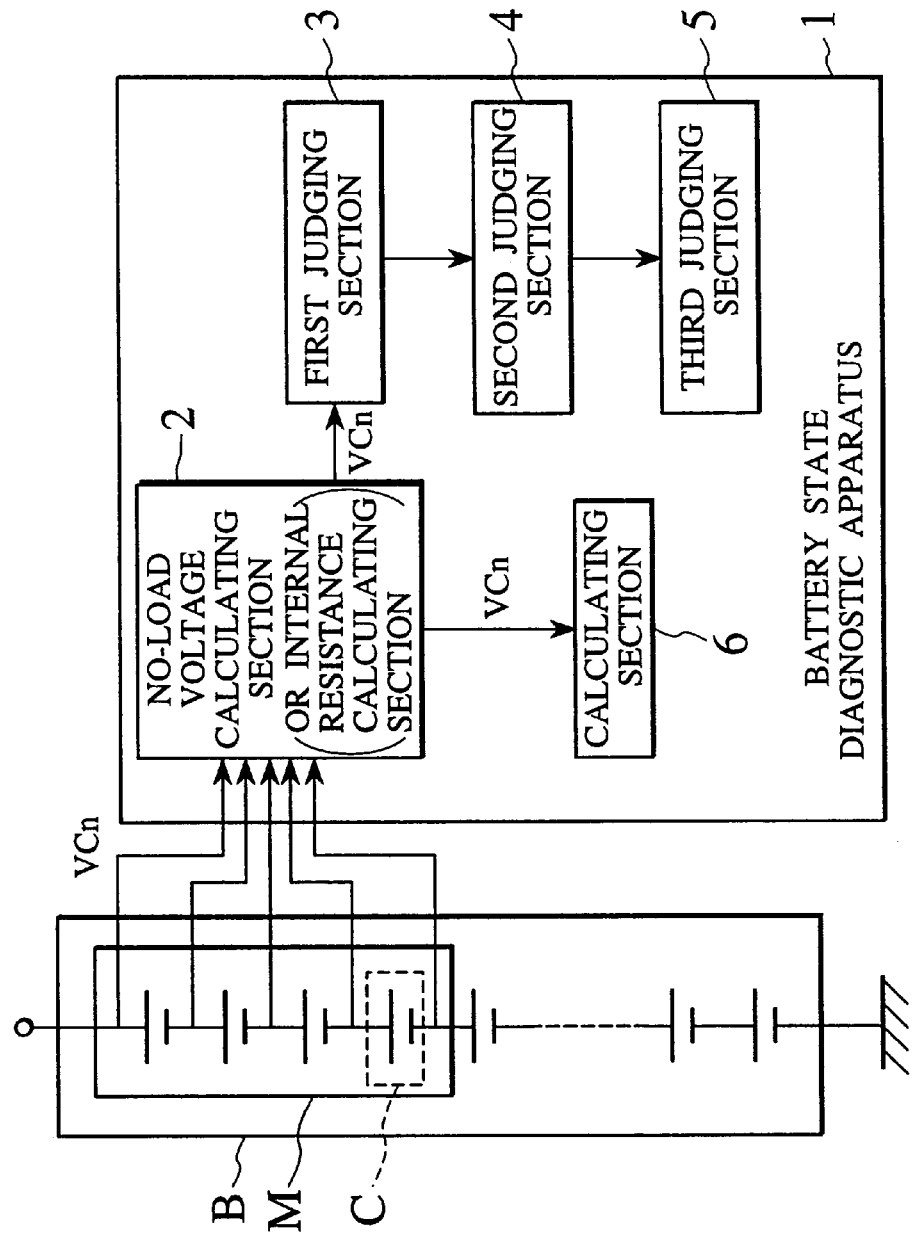
FIG. 1 is a block diagram showing an embodiment of a battery state diagnostic apparatus according to the present invention.

As shown in FIG. 1, a battery state diagnosing apparatus 1 comprises a no-load voltage calculating section (or an internal resistance calculating section) 2 for calculating no-load voltage (or internal resistance) of the cell, a first judging section 3 for judging whether a battery state of each of the cells is normal or abnormal based on the no-load voltage (or internal resistance) of the cell calculated by the no-load voltage calculating section (or internal resistance calculating section) 2, and a second judging section 4 for judging that a battery module including a cell or cells determined to be abnormal by the first judging section 3 is an abnormal battery module which requires replacement.

Examples of the no-load voltage calculating section voltage (or an internal resistance calculating section) include cell controller C/C1–C/CL2 for obtaining a cell voltage (or internal resistance) when there is no load (or load) based on a signal of a voltage sensor provided in a cell and a battery controller BIC for estimating the cell voltage (or internal resistance) when there is no load (or load) based on a discharge characteristic obtained from electric current and voltage during running.

The battery state diagnostic apparatus 1 further includes a third judging section 5 for determing that, when the number of battery modules determined to be abnormal by the second judging section 4 is equal to or more than the predetermined number, the battery set need to be indicted as being abnormal.

The battery state diagnostic apparatus 1 further includes a calculating section 6 for calculating the average voltage value (and/or the average internal resistance) of the battery modules determined to be normal by the second judging section, based on the no-load voltage (or the internal resistance) of the-cell calculated by the no-load voltage calculating section (or an internal resistance calculating section).

Figure 3:
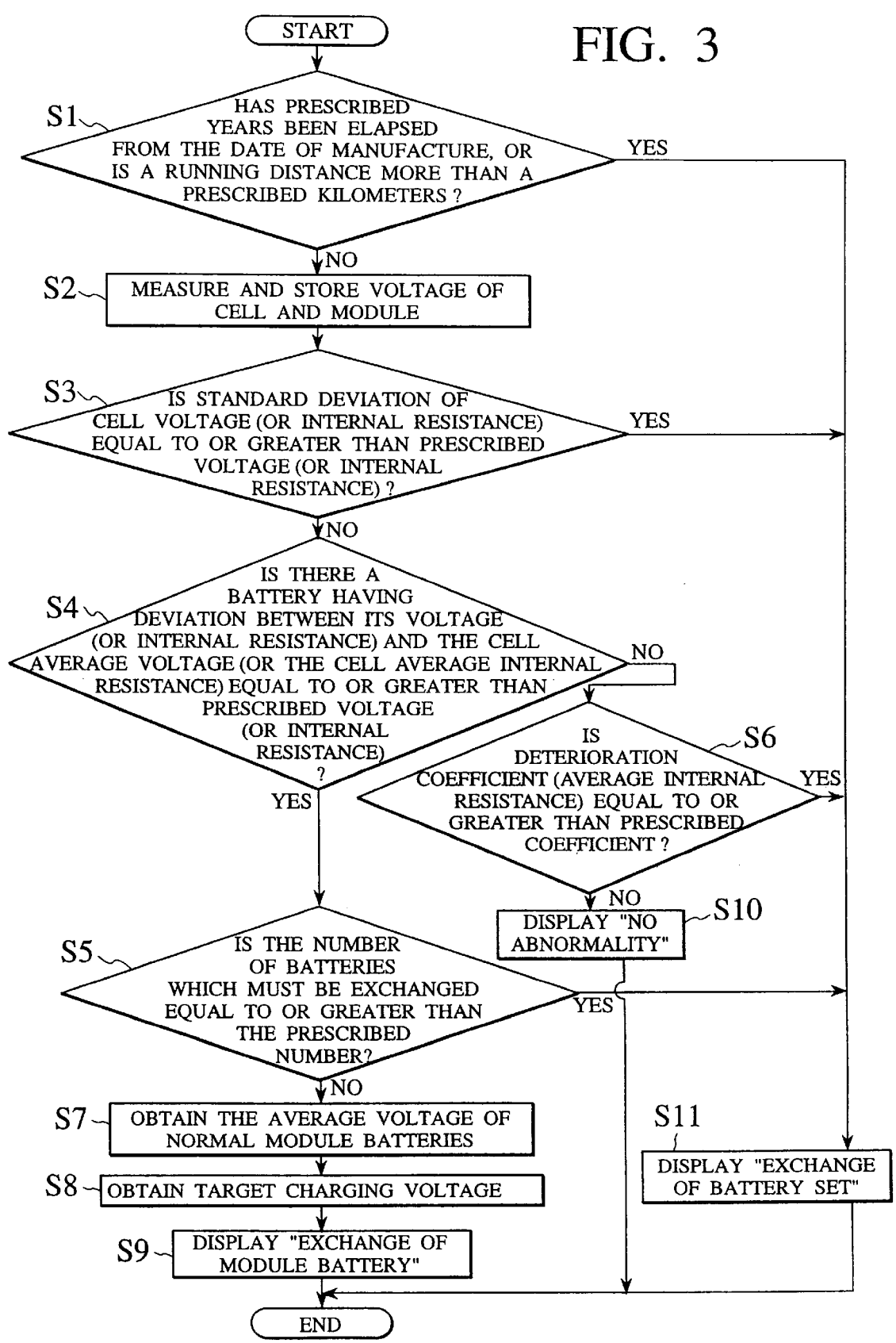
FIG. 3 is a flowchart for explaining operation of a battery controller (BIC)

FIG. 3 Is a flowchart which shows the operation of the battery controller B/C. With reference to FIG. 3, a procedure for determining a qualitative state of the battery will be explained. First, in step S1, it is determined whether a prescribed period (e.g. a given number of years) has elapsed since the date of manufacture, or whether the battery has been used over an operating distance in excess of a predetermined number of kilometers. If any one of the two conditions is satisfied, it is determined that the life span of the battery has expired and the process advances to step S11 where exchange of the battery set is indicated as being necessary. For example, the exchange of battery is displayed in a warning device 11. On the other hand if neither of two condition is met, the process goes to step S2.

Figure 4:
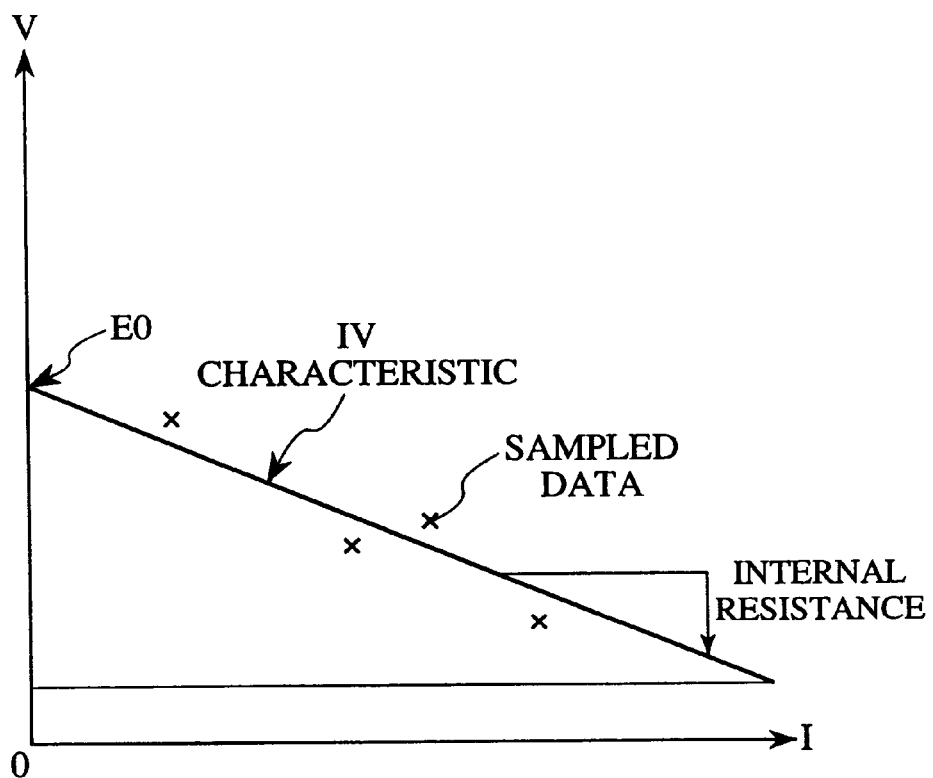
FIG. 4 is a graph demonstrating open-circuit voltage estimating method used during running of a vehicle.

In step S2, cell voltage and module voltage are measured and stored. When the battery set takes the form of a lithium ion battery, cell voltage can be used as a substitute characteristic of electric quantity (capacity) of a battery and therefore, the quality of battery is determined using cell voltage. The results are stored in memories (not shown) provided in the cell controllers C/C1, C/C2, . . . , C/C12. At this time, (1) voltage is measured when the battery is in a no-load voltage state (before the vehicle is started or before the battery is charged), or (2) no-load voltage is estimated from discharge IV characteristic. In the case of (2), electric current 1 and voltage V during running are sampled as shown in FIG. 4, a discharge IV characteristic straight line is obtained from the sampled data, open-circuit voltage is estimated from voltage intercept EO of the characteristic straight line, and the estimated value is determined as a no-load voltage.

An internal resistance also can be estimated from an inclination of the characteristic straight line. In addition, it is also possible to send the current value from the battery controller B/C to the cell controllers c/cl–c/cl2 and to estimate a discharge IV characteristic straight line to obtain an internal resistance, and then to send the internal resistance to the battery controller B/C.

In step S31 it is determined whether a standard deviation of cell calculated using the cell voltage (or internal resistance) obtained in step S2 is equal to or greater than a prescribed voltage (or internal resistance) prescribed as a standard of battery set exchange, As a result, if the standard deviation is equal to or greater than the prescribed voltage (or internal resistance), the processing is advanced to step S11, otherwise, the processing is advanced to step S4. Step S4 is a step in which it is determined whether there is a battery module whose deviation of cell voltage (or internal resistance) with respect to the cell average voltage (or internal resistance) obtained by averaging voltages (or internal resistances) of all the cells is equal to or greater than the prescribed voltage (or internal resistance) prescribed as a standard of the battery module exchange. If there is a battery module having the prescribed voltage (or internal resistance) or greater, the processing is advanced to step S5, and if such a battery module does not exist, the processing is advanced to step S6.

Figure 5:
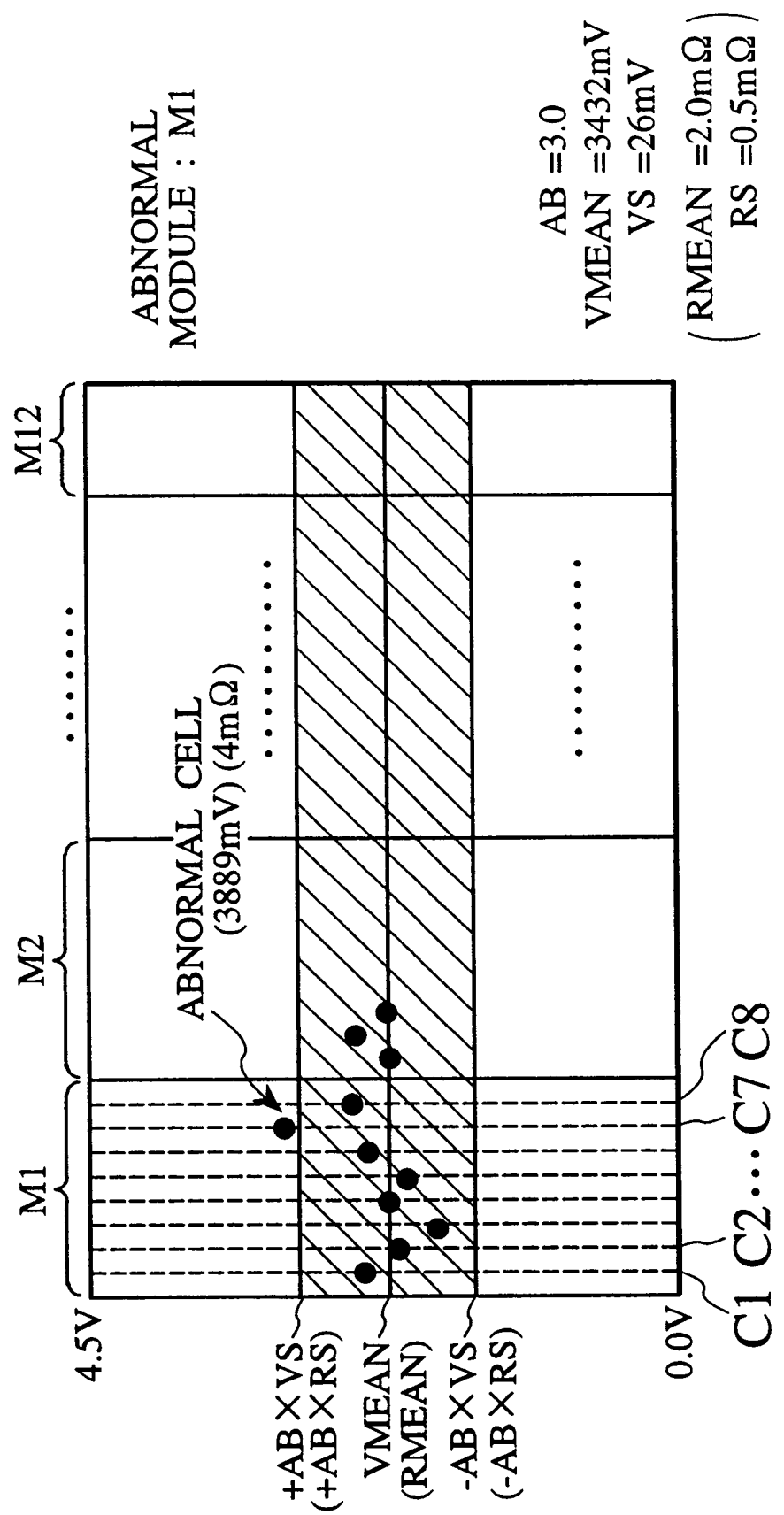
FIG. 5 is a diagram detailing step S3 shown in FIG. 3.

FIG. 5 is a diagram for simply explaining the judgment carried out in step S4, and shows a voltage (or internal resistance) of each of the cells. Black circles in FIG. 5 show cell voltages (or internal resistance). Since the battery module is constituted by eight cells. eight black circles are indicated in a region showing the battery module M1. A vertical line represents voltage, VMEAN shows cell average voltage and VS represents standard deviation (or the vertical line represent internal resistance, RMEAN shows cell internal resistance and RS represents standard deviation). In the present embodiment, a prescribed voltage (or internal resistance) of the battery module is represented by ABXVS (or ABXRS) and here, AB=3. In the example shown in FIG. 5, if the cell voltage (or internal resistance) exceeds a range of 3432±78(mV) (or 2.0±1.5(mU)) I it is determined that the cell is abnormal and the battery module including such an abnormal cell is abnormal. Referring to the battery module M1, a voltage (or internal resistance) of the cell C7 indicated by the arrow is 3889 (mV) (or 4 mU) and is determined to be abnormal and thus, it is determined that the, battery module M1 is abnormal.

If a variation in cell voltage of the battery set is determined to be small, and the processing is advanced from step S4 to step S6,. it is determined if the deterioration coefficient (average internal resistance) of the battery set is equal to or greater than the prescribed value which is a standard of the life of battery. If it is YES, it is determined that the battery is normal, and the processing is advanced to step S10 to display on the warning device 11 that there is no abnormality in the battery. If the deterioration coefficient (average internal resistance) is smaller than the prescribed value, it is determined that the life of the battery set is over, and the processing is advanced to step S11. That is, even when it is determined that the deterioration coefficient (average internal resistance) is smaller than the prescribed value in step S4, there is a possibility that all the cells may be uniformly deteriorated, it is determined in step S6 whether all the cells are uniformly deteriorated, by the deterioration coefficient (average internal resistance).

Here, the deterioration coefficient shows an internal resistance and a substitute characteristic of capacity, and is calculated from the IV characteristic measured during running of the vehicle. As a deterioration coefficient, there is parameter $\beta$ representing a variation in capacity, and parameter $\gamma$ representing a variation in internal resistance. For example, in the case of the parameter $\gamma$ this is obtained by a ratio of a power calculating value Pful obtained at the time of fully charging of a battery, to a value Pref of P when Wh=O in the relation Wh=Wh(P) between a discharging electric power amount Wh and a possible discharging power P of a battery before the deterioration is taken into account. The inclination of the discharge IV characteristic straight line of the battery set represents an internal resistance, and a ratio of the early internal resistance to the present internal resistance can be used. On the other hand, in the case of the parameter $\beta$, $\beta$ is regarded as being equal to $\gamma$ ($\beta=\gamma$) in many cases. Another method is that a correlation between $\beta$ and $\gamma$: $\beta=\delta(\gamma)$ is previously obtained, and the $\gamma$ obtained in the above-described manner is substituted in $\delta(\gamma)$. thereby obtaining $\beta$.

When the processing is advanced from step S4 to step S5, it is determined whether the number of battery modules which are required for exchange is equal to or greater than the prescribed number. If the number of battery modules which are required for exchange is equal to or greater than the prescribed number, this means that the life span of the battery set has expired, the processing is advanced to step S11, and if the number is smaller than the prescribed number, the processing is advanced to step S7. Subsequent steps S7 and S8 are steps for obtaining "average value of normal battery modules" (step S7) and "target charging voltage value" (step S8) used when the abnormal battery module is exchange. After these values are calculated, the processing is advanced to step 39 where the exchange of battery is displayed on the warning device 11.

Figure 6:
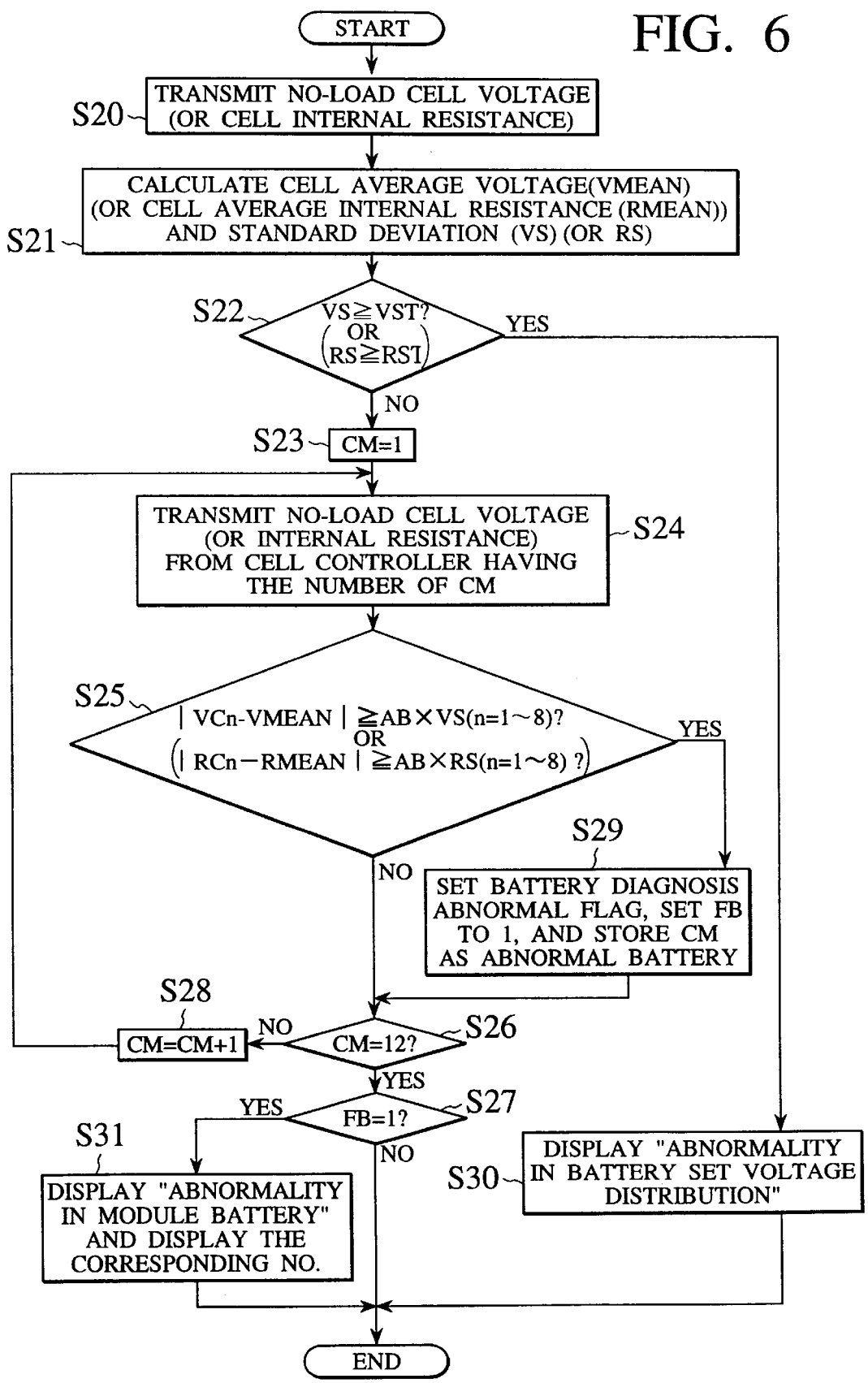
FIG. 6 is a flowchart showing battery abnormality diagnosis.

FIG. 6 shows a concrete example of portions of judgment of standard deviation of cell voltage (or internal resistance)

(step S3) and judgment of deviation between standard deviation and the cell average voltage (or internal resistance) (step S4) in the flowchart shown in FIG. 3, and is a flowchart of battery abnormality diagnosis. In step S20, commands are sent from the battery controller B/C to the cell controller C/C1 to C/C12, and the measured no-load cell voltage (or internal resistance) data are transmitted from the cell controller C/C1 to C/C12 to the battery controller BIC. In step S21, the cell average voltage VMEAN (or cell average internal resistance) and the standard deviation VS (or RS) are calculated using data of all the cells. Although the precision is lowered, calculation may be conducted using voltage of module instead of using data of all the cells.

Step S22 corresponds to step S3 in FIG. 3, where it is determined whether the standard deviation VS is equal to or greater than the prescribed voltage VST (internal resistance RST). If it is Yes, the processing is advanced to step S30 To indicate on the warning device 11 that voltage (or internal resistance) distribution of battery set is abnormal and to recommend to exchange battery set. If it is No, the processing is advanced to step S23 to proceed the judgment of abnormality of each of cells- In general, the prescribed voltage VST (or internal resistance RST) relies on the cell average voltage VMEAN (or cell average internal resistance RMEAN), and when the prescribed voltage VST (or internal resistance RST) has a relation as shown in FIG. 7A (or FIG. 7C) f or example, a, value obtained by interpolation calculation using a conversion Table of eight lattices as shown in FIG. 8A is used. For example, when the cell average voltage VMEAN is 2,800 (mV), the judgment is made using the prescribed voltage VST=50 (mV)(or the prescribed internal resistance RST=2 (mΩ).

A variable CM in step S23 represent the number of twelve cell controllers C/C1 to C/C12. After the variable is initialized in step S23 (CM=1), no-load voltage (or internal resistance) data of eight cells included in a battery module is transmitted from the cell controller having the number of CM to the battery controller B/C in step S24. If the processing is advanced from step S23 to step S24, no-load voltage (or internal resistance) data of cells C1 to CS included in the battery module M1 are transmitted. Step S25 corresponds to step S4 in FIG. 3, where it is determined whether the deviation of cell voltage (or internal resistance) with respect to the cell average voltage (or cell average internal resistance) is equal to or greater than the prescribed voltage (or internal resistance), for each of the eight cells. In FIG. 6. VCn represents no-load voltage (or internal resistance) of n-th cell in the eight cells. In step S25, if any of the eight cells satisfies the condition, it is determined to be YES, and the processing is advanced to step S29. If it is None of the eight cells satisfy the condition, the processing is advanced To step S26.

In general, the variable AB relies on the average voltage VMEAN, and has a relation as shown in FIG. 7B f or example. In This case, similarly to the prescribed voltage VST, a value obtained by interpolation calculation using a conversion table of eight lattices is used. A table shown in FIG. 8B is an example when the prescribed voltage is equal to 3 X (standard deviation).

If the processing is advanced from step S25 to step S29, since the battery module was determined to be abnormal, a battery diagnosis abnormal flag is set so that the variable FB is set to 1, and a value of the variable CM at that time is stored as a number of abnormal battery, and the processing is moved to step S26. Step S26 is a step for judging whether the variable CM is 12. If it is Yes, the processing is advanced to step S27, and if it is No, the processing is advanced to step S28 where 1 is added to the value of the variable CM and then, the processing is moved back to step S24. After it is determined whether a deviation of the cell voltage (or internal resistance) with respect to the cell average voltage (or cell average internal resistance) if equal to or greater than the prescribed voltage (or internal resistance) (step S25) for all the battery modules in this manner, the processing is advanced from step S26 to step S27. Step S27 is a step for judging whether FB is equal to 1. If it is Yes, the processing is advanced to step S31 where the CM stored in step S29, i.e., the number of module judges as abnormal battery module is displayed to recommend the exchange of battery module. On the other hand, If it is No in step S27, this means that the battery set is determined to be normal.

According to the present embodiment, detection of each of cell voltages (or internal resistance), judgment whether battery module is normal or abnormal based on detection result, and judgment whether the battery set need To be exchanged are made automatically by the battery controller B/C mounted in the vehicle. Therefore, as compared with the conventional case in which the battery set is brought out from the vehicle to manually detect the cell voltage and to manually calculate for exchange of the battery module, it is very easy to exchange the battery module, and the operation time can be shortened. In addition, it is possible to decide the deterioration of the cell internal resistance which cannot be decided through a measurement of the non-load voltage. The non-load voltage is a substitute characteristic of capacity, namely state of charge (SOC), and the deterioration of power can be decided with the internal resistance as a substitute characteristic.

Voltage Adjustment of Substitute Battery Module

Figures 9A, 9B:
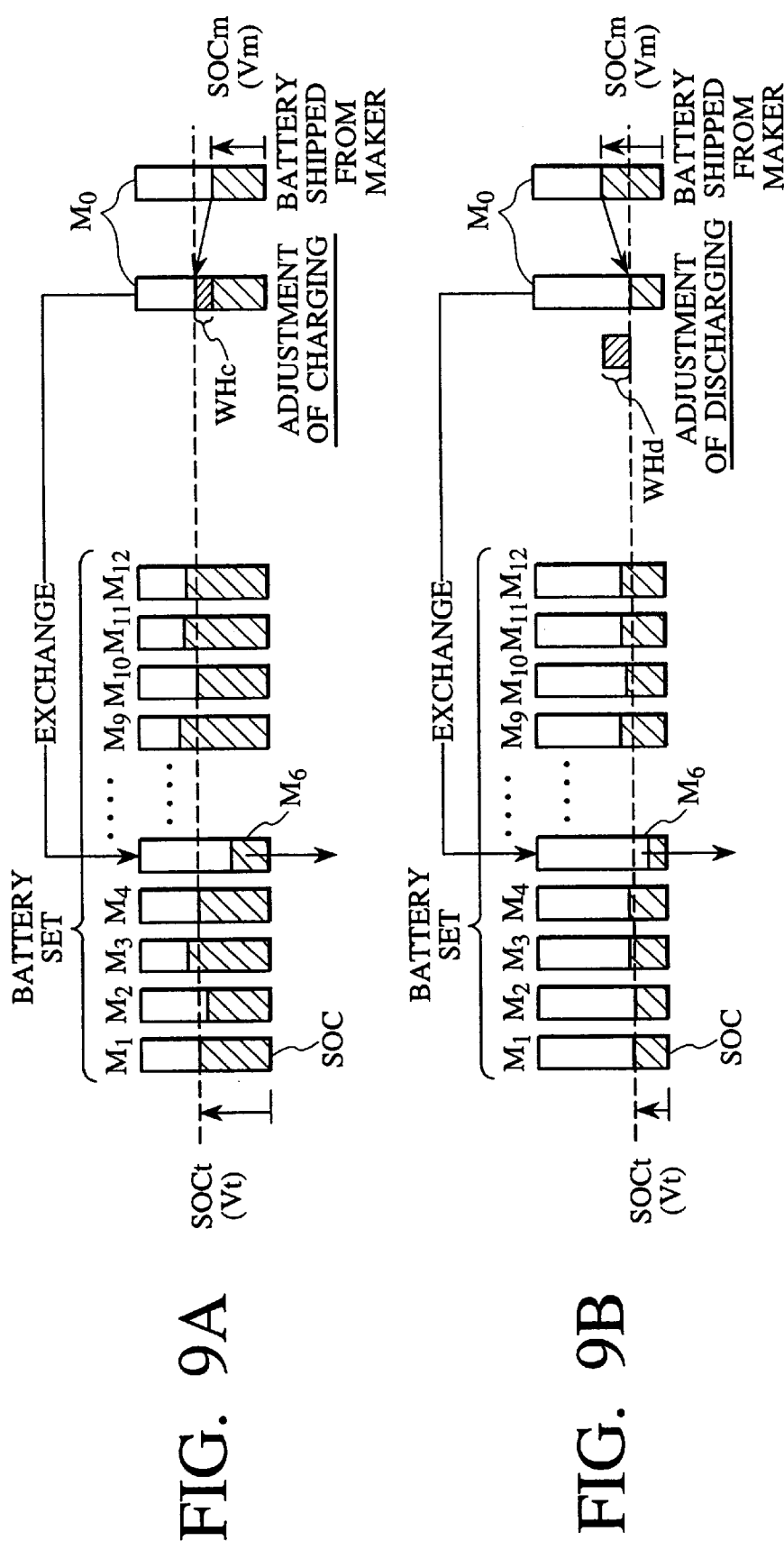
FIGS. 9A and 9B are diagrams demonstrating voltage adjustment of a substitute battery module when the battery is exchanged.

If it is determined that there is an abnormal battery module in the battery set by the above-described procedure, the abnormal battery module is replaced by a new substitute battery module. Adjustment of voltage of substitute battery module when battery module is exchanged will be explained below. FIGS. 9A and 9B are diagrams for explaining adjustment of charging state when the battery is exchanged, wherein FIG. 9A shows a case in which the charging of the substitute battery module is adjusted, and FIG. 9B shows a case in which the discharging of the substitute battery module is adjusted. The battery set is constituted by twelve battery modules M1 to M12. In FIGS. 9A and 98, hatching portions of the battery modules M1 to M12 represent SOC of the battery modules, and the smaller the hatching portion is, the smaller SOC is. SOCt represent SOC of the battery set, which is the average value of SOCs of the battery modules M1 to M12. It is preferable to calculate the SOCt excluding the abnormal battery module M6, However, the number of abnormal cells is normally one in many cases, and since an influence of voltage of one cell among ninety six cells is small, there is not a serious problem to calculate including the battery module M6. In any of the battery sets shown in FIGS. 9A and 9B, the 6-th battery module M6 is determined to be an abnormal battery module.

There are various SOCt of the battery set requiring the exchange of battery module, but in a new battery module MO, the SOC is limited to a predetermined SOCm. Therefore, if the abnormal battery module M6 is replaced by the new battery module MO as it is. this means that a battery module having a different battery stale is mixed into the battery set, there is a problem that deterioration or a shortage of capacity are generated due to excessive charging. Therefore, it is preferable that batteries are exchanged after adjusting the charging state (SOCm) of the substitute battery module MO to SOCt of the battery set. Although the above explanation was made using SOC, the relation between the SOC and The no-load voltage (open-circuit voltage) has a relatively linear characteristic in Li-ion battery, there is no practical problem even if the battery state is determined from the no-load voltage (open-circuit voltage). Therefore explanation will be made using the no-load voltages Vt and Vm instead of SOCt and SOCm.

In the case of FIG. 9A, since the voltage Vm of the substitute battery module MO is smaller than the voltage Vt of the battery set, electricity is charged by WHc until the voltage reaches Vt using a charger. On the other hand, in the case of FIG. 9B, since the voltage Vm of the substitute battery module MO is greater than the voltage Vt of the battery set, electricity is discharged by WHd until the voltage reaches VT using a discharger.

Figure 10:
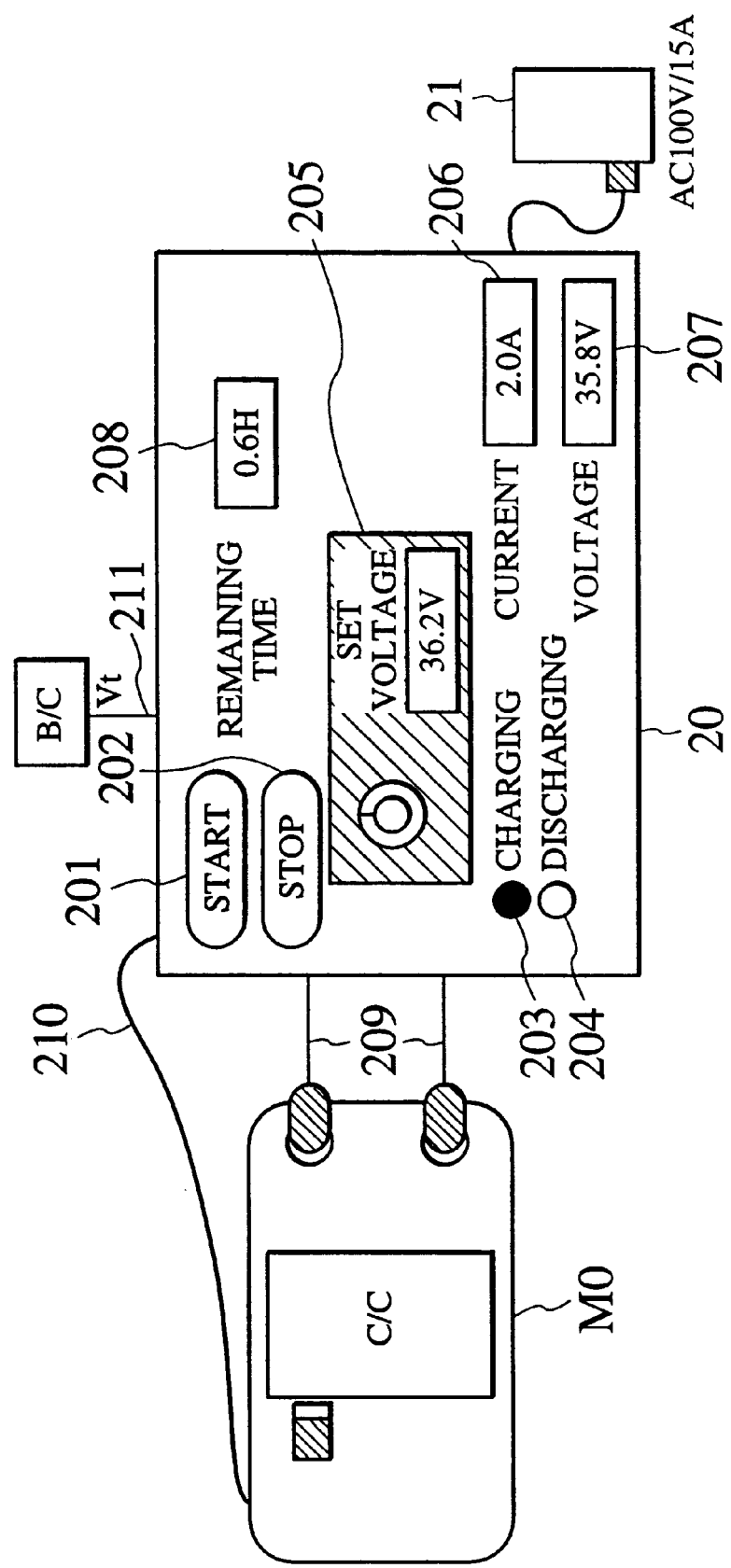
FIG. 10 is a diagram showing voltage adjustment of substitute battery module by a module charger/discharger.

FIG. 10 is a diagram for explaining voltage adjustment of a substitute battery module by a module charger/discharger. The reference number 20 represents a module charger/discharger, MO represents a substitute battery module. The module charger/discharger 20 comprises a charging start switch 201, charging stop switch 202, a display 203 f or showing "charging", display 204 showing "discharging", a display 206 for showing electric current during charging and discharging, a display 207 for showing voltage during charging and discharging, and a display 208 for showing remaining time until completion of charging. Further, for charging electricity to the substitute battery module MO, The module charger/discharger 20 also includes electric power lines 209 connected to terminals of the substitute battery module MO, a communication line 210 connected to the cell controller C/C of the substitute battery module MO, and a communication line connected to the battery controller B/C mounted in the vehicle. The reference number 21 represents a power source for supplying electricity to the module charger/discharger 20.

Figure 11:
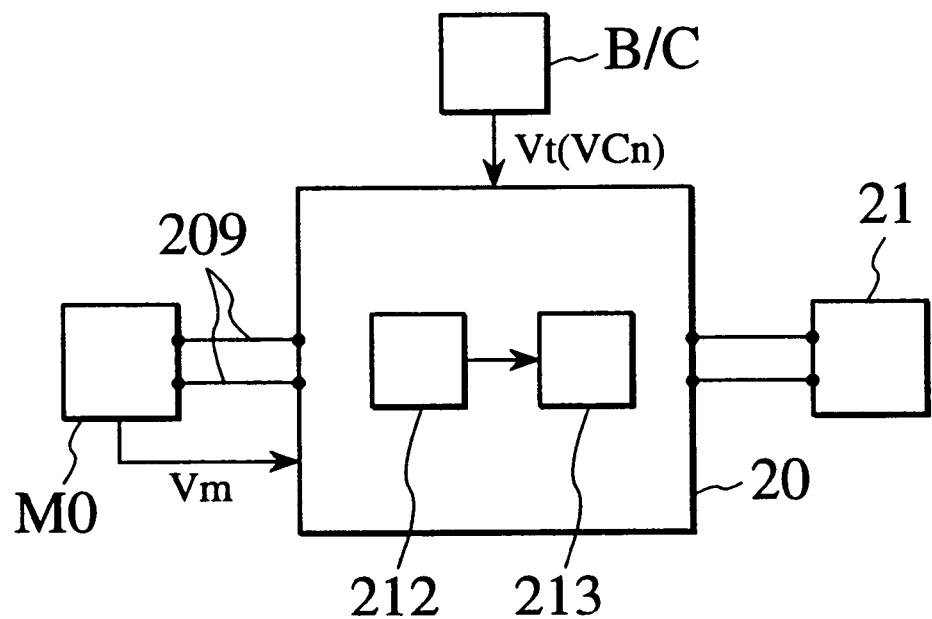
FIG. 11 is a block diagram of module charger/discharger.

FIG. 11 is a block diagram of the module charger/discharger shown in FIG. 10, the reference number 212 denotes a calculating section, the reference number 213 denotes a display section showing the display 203 and the like. The calculating section 212 calculates charging and discharging time of the substitute battery module MO based on the voltage Vt from the battery controller B/C (the average voltage value of normal battery modules) and the voltage Vm of the substitute battery module MO, and judges whether charging or discharging by comparing magnitudes of the voltage Vt and the voltage Vm. The calculated charging and discharging time is displayed on the display section 213 (display 208). Charging or discharging of the substitute battery module MO is conducted based on the result of judgment by the calculating section 212.

In the above-described example, although the average voltage Vt is calculated by the battery controller B/C, the average voltage Vt may be calculated by the calculating section 212 using the cell voltage VCn from the battery controller B/C.

Figure 12:
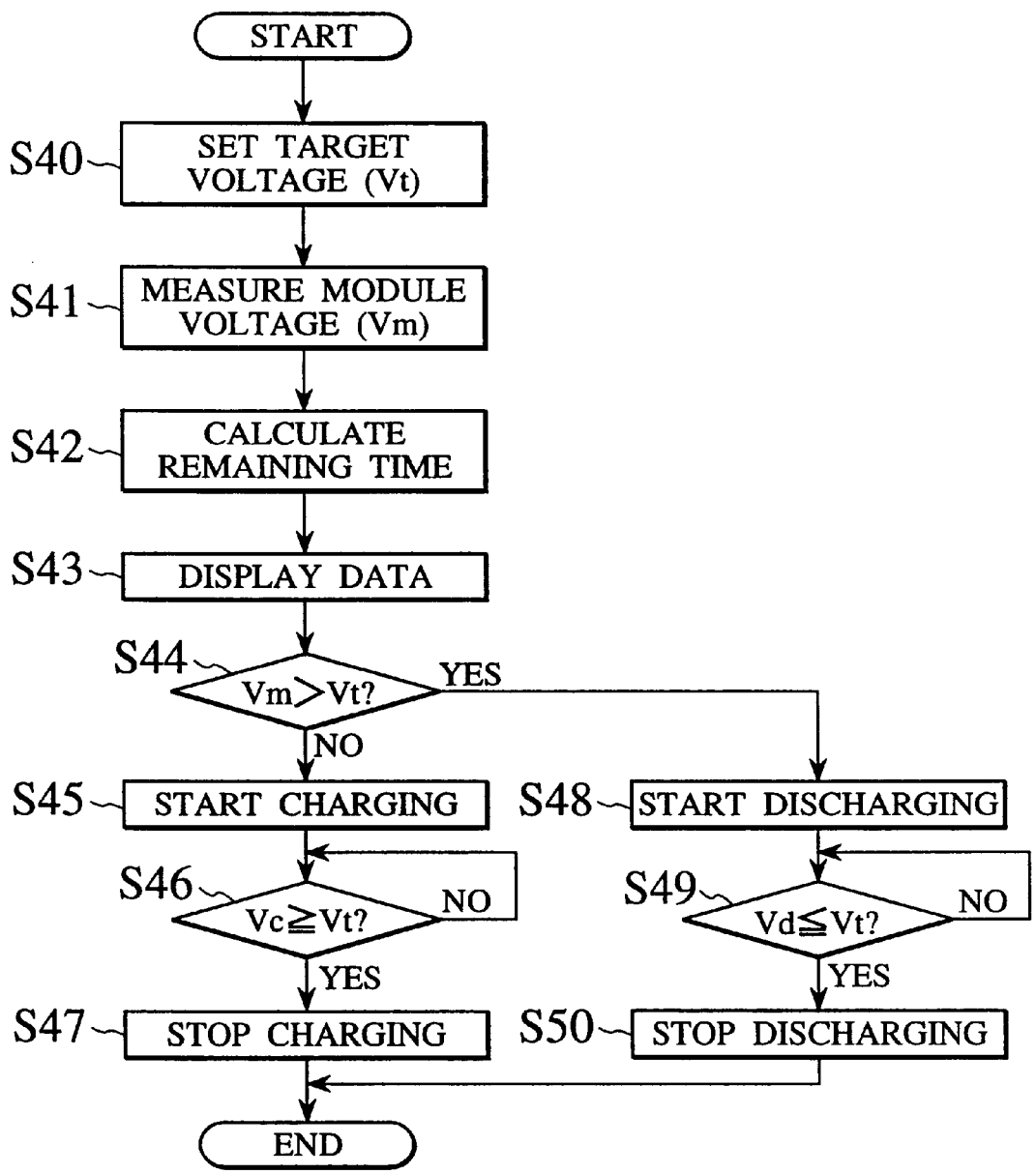
FIG. 12 is a flowchart showing charging operation by a module charger/discharger.

FIG. 12 is a flowchart for showing the charging operation by the module charger/ discharger 20. Each of the lines 209 to 211 of the module charger/discharger 20 are connected to the substitute battery module MO, the battery controller B/C, and if the start switch 201 is turned on, the flow is started. In step S40, the above-described voltage VT is received from the battery controller B/C, and the value Vt is set as a target voltage of completion of charging and discharging. The target voltage may be set by inputting to the module charger/discharger manually instead of communication. In this case, the voltage set manually is displayed on the display 205. In step S41, the battery module 20 sends a signal To the cell controller C/C such That The voltage Vm before adjustment of the substitute battery module MO, and receives the measurement result from the self controller C/C. In step S42, charging time or discharging Time is calculated based on the voltages Vt and Vm from the battery controller B/C. In step S43, data Vt and the completion time are displayed on the displays 205 and 208.

Step S44 is a step for judging whether the voltage Vm of The substitute battery module MO is greater than the Target voltage VT, i.e. , whether electricity should be discharged from or charged to the substitute battery module MO. If Vm>Vt, the processing is advanced to step S48, and otherwise, the processing is advanced to step S45. If the processing is advanced from step S44 to step S45, charging is started to turn on the display 203 which shows "charging", and current and voltage of charging are displayed on the displays 206 and 207, and the processing is advanced to step S46. Step S46 is a step for judging whether the charging voltage Vc is equal to or greater than the target voltage VT, i.w. , whether the charging has been completed. If the charging voltage Vc is equal to Or greater than the target voltage Vt (Vc Vt), the processing is advanced to step S47 where the charging is stopped and the display 203 is turned off.

On the other hand, if the processing is advanced from step S44 to step S48, the discharging is started to turn on the display 204 which shows "discharging", and current and voltage of discharging are displayed on the displays 206 and 207, and the processing is advanced to step S49. Step S49 is a step for judging whether the discharging voltage Vd is equal to or smaller than the target voltage Vt, i.w., whether the discharging has been completed. If the discharging voltage Vd is equal to or smaller than the target voltage Vt, the processing is advanced to step S50 where the discharging is stopped and the display 204 is turned off. With the above operation, since the adjustment of charging state of the substitute battery module MO has been completed, the abnormal battery module M6 (see FIG. 9) of the battery set is replaced by the substitute battery module MO.

Figures 13A, 13B:
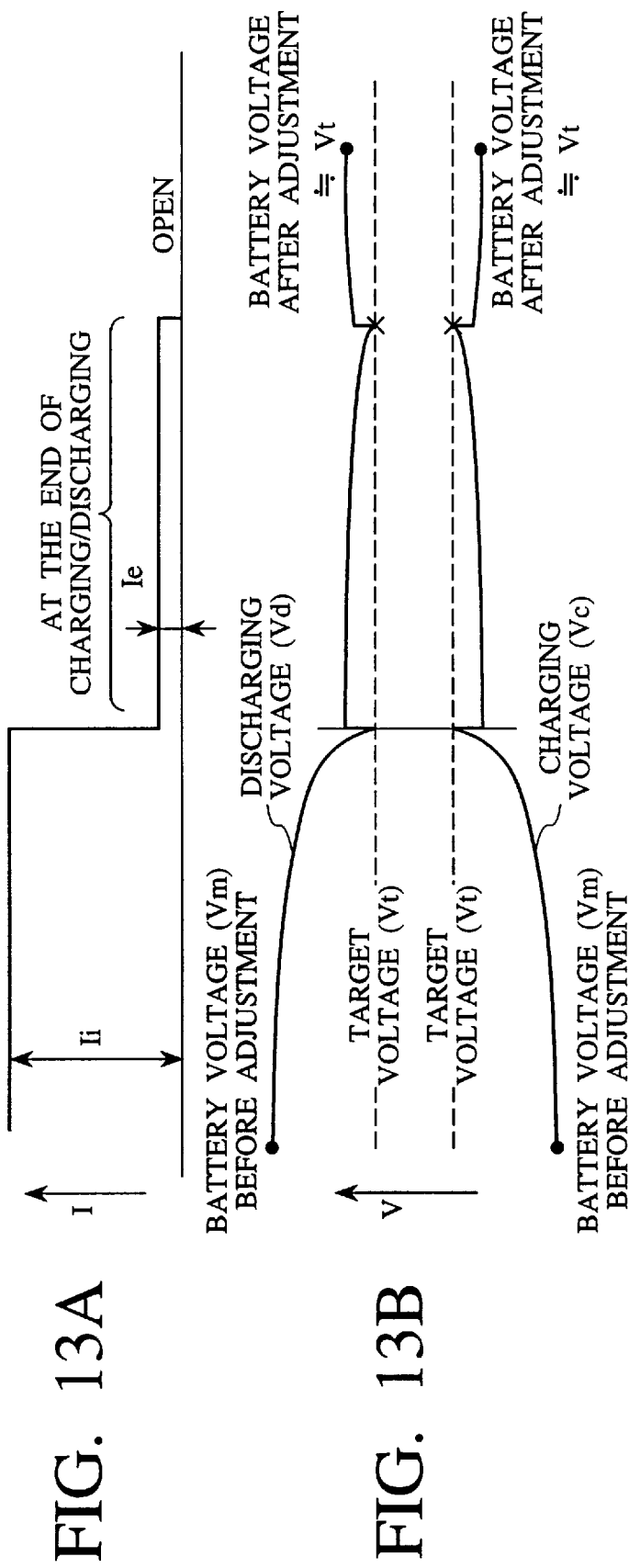

FIGS. 13A ad 13B are diagrams conceptionally showing variations in current 1 and voltage V at the time of charging and discharging, wherein FIG. 13A shows a variation in current l, and FIG. 13B shows a variation in voltage V. As shown in FIG. 13A, charging and discharging are carried out at a constant current value li, and at the end of charging or discharging, current is reduced to current value le (called end current) Alternatively, double CC charging is carried out in which electricity is charged at current li and if the voltage reaches Vt, current is changed from li to le, and charging is started again, and if the voltage reaches Vt again, charging is completed. The end current le is set to a low current less than 5 (A). By reducing the current at the end of charging and discharging in this manner, it is possible to reduce an influence of voltage 1•R due to battery internal resistance R, and voltage can precisely be adjusted to the target voltage. As shown in FIG. 13B, if the charging or discharging is completed, and battery terminal is opened, battery voltage is slightly varied (increase in the case of discharging, and reduce in the case of charging), battery voltage after adjustment becomes substantially Vt.

As described above, (1) voltage Vt sent from the battery controller B/C, (2) voltage Vt calculated by the calculating section based on cell voltage VCn, or (3) voltage displayed on the display 12 by the battery controller B/C which is manually inputted to the module charger/discharger 20 is used as the target voltage, electricity is charged or discharged to the substitute battery module MO. Therefore, it is possible to easily adjust the SOC of the substitute battery module MO when the battery module is exchanged.

The relationship between the elements in the above-described embodiment and elements within scope of claims for patent is as follows: the cell controllers C/C1 to C/C12 correspond non-load voltage calculating section, the battery controller B/C corresponds to first to third judging section and calculating section, and the cell controllers C/C1 to C/C12 and the battery controller B/C corresponds to the battery state diagnostic apparatus.

What is claimed is:

1. A diagnostic apparatus for diagnosing a state of charge of a battery set including a plurality of battery modules each having a plurality of cells, comprising:

a no-load voltage calculating section for calculating no-load voltage of the cell;

a first judging section for determining whether a state of charge of each of the cells is normal or abnormal based on the no-load voltage of the cell calculated by the no-load voltage calculating section; and a second judging section for determining that a battery module including a cell judged to be abnormal by the first judging section is an abnormal battery module which is required to be replaced.

2. A diagnostic apparatus according to claim 1, further comprising a third judging section for determining that, when a number of battery modules judged to be abnormal by the second judging section is equal to or more than a predetermined number, the battery set is abnormal.

3. A diagnostic apparatus according to claim 1, further comprising a calculating section for calculating an average voltage value of the battery modules determined to be normal, based on the no-load voltage of the cell calculated by the no-load voltage calculating section.

4. An electric car provided with a battery set including a plurality of battery modules having a plurality of cells, the electric car comprising a diagnostic apparatus for diagnosing battery charge status comprising:

a no-load voltage calculating section for calculating no-load voltage of the cell;

a first judging section for determining whether a state of charge of each of the cells is normal or abnormal based on the no-load voltage of the cell calculated by the no-load voltage calculating section; and a second judging section for determining that a battery module including a cell judged to be abnormal by the first judging section is an abnormal battery which requires replacement.

5. A module charger/discharger for adjusting a voltage of a replacement battery module which is used to replace an abnormal battery module in a battery set including a plurality of battery modules having a plurality of cells, the module charger/discharger comprising:

an average voltage calculating section for calculating the average voltage value of a plurality of battery modules judged to be normal by a battery diagnostic apparatus, wherein the replacement battery module is charged or discharged such that the voltage of the replacement battery module assumes the average voltage value calculated by the average voltage calculating section;

the battery diagnostic apparatus comprising:

a no-load voltage calculating section for calculating a no-load voltage of each of the cells;

a first judging section for judging whether a state of charge of each of the cells is normal or abnormal based on the no-load voltage of the cell calculated by the no-load voltage calculating section; and a second judging section for judging that a battery module including a cell judged to be abnormal by the first judging section is an abnormal battery module which requires replacement.

6. A module charger/discharger for adjusting a voltage of a replacement battery module which is used to replace an abnormal battery module of a battery set including a plurality of battery modules having a plurality of cells, wherein the replacement battery module is charged or discharged such that the voltage of the replacement battery module assumes the average voltage value calculated by a battery state diagnostic apparatus comprising:

a no-load voltage calculating section for calculating no-load voltage of the cell;

a first judging section for judging whether a battery state of each of the cells is normal or abnormal based on the no-load voltage of the cell calculated by the no-load voltage calculating section; and a second judging section for judging that a battery module including a cell judged to be abnormal by the first judging section is an abnormal battery module which requires replacement.

7. A diagnostic apparatus for a battery set including a plurality of battery modules having a plurality of cells, comprising:

an internal resistance calculating section for calculating internal resistance of each of the cells;

a first judging section for judging whether a state of charge of each of the cells is normal or abnormal based on the internal resistance of the cells calculated by the internal resistance calculating section; and a second judging section for judging that a battery module including a cell determined to be abnormal by the first judging section is an abnormal battery module which requires replacement.

8. A diagnostic apparatus according to claim 7, further comprising a third judging section for determining that, when the number of module batteries determined to be abnormal by the second judging section is equal to or more than a predetermined number, the battery set is abnormal.

9. A diagnostic apparatus according to claim 7, further comprising a calculating section for calculating an average internal resistance value of the battery modules determined to be normal, based on the internal resistance of the cell calculated by the internal resistance calculating section.

10. An electric car provided with a battery set including a plurality of battery modules each having a plurality of cells, the electric car comprising a diagnostic apparatus for diagnosing the state of the battery modules comprising:

an internal resistance calculating section for calculating internal resistance of each of the cells;

a first judging section for judging whether a state of charge of each of the cells is normal or abnormal based on the internal resistance of the cells calculated by the internal resistance calculating section; and a second judging section for judging that a battery module including a cell determined to be abnormal by the first judging section is an abnormal battery module which requires replacement.

11. A module charger/discharger for adjusting a voltage of a replacement battery module which is used to replace an abnormal battery module in a battery set including a plurality of battery modules which each have a plurality of cells, the module charger/discharger comprising:

an average voltage calculating section for calculating the average voltage value of a plurality of battery modules determined to be normal by a battery diagnostic apparatus, wherein the replacement battery module is charged or discharged such that the voltage of the replacement battery module assumes the average voltage value calculated by the average voltage calculating section;

the battery diagnostic apparatus comprising:

an internal resistance calculating section for calculating internal resistance of each of the cells;

a first judging section for determining whether a state of charge of each of the cells is normal or abnormal based on the internal resistance of the cell calculated by the internal resistance calculating section; and a second judging section for judging that a battery module including a cell determined to be abnormal by the first judging section is an abnormal battery module which requires replacement.

12. A module charger/discharger for adjusting a voltage of a replacement battery module which is used to replace an abnormal battery module of a battery set including a plurality of battery modules which each have a plurality of cells, wherein the replacement battery module is charged or discharged such that the voltage of the replacement battery module assumes an average voltage value calculated by a battery diagnostic apparatus comprising:

an internal resistance calculating section for calculating internal resistance of each of the cells;

a first judging section for judging whether a state of charge of each of the cells is normal or abnormal based on the internal resistance of the cell calculated by the internal resistance calculating section; and a second judging section for judging that a battery module including a cell judged to be abnormal by the first judging section is an abnormal battery module which requires replacement.

* * * * *